United States Patent
Wu et al.

(10) Patent No.: US 7,043,598 B2
(45) Date of Patent: May 9, 2006

(54) METHOD AND APPARATUS FOR DYNAMIC MEMORY REFRESHING

(75) Inventors: Chuan-Yu Wu, Taipei (TW); Jia-Ming Yang, Hsin-Chu (TW); Chris Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 465 days.

(21) Appl. No.: 10/036,838

(22) Filed: Dec. 31, 2001

(65) Prior Publication Data

US 2003/0126357 A1 Jul. 3, 2003

(51) Int. Cl.
G11C 8/18 (2006.01)

(52) U.S. Cl. ............... 711/106; 711/5; 711/100; 711/106; 365/230.01; 365/230.03

(58) Field of Classification Search ............... 711/106, 711/105, 167–168, 100, 5, 102, 103, 163–164; 365/222, 233
See application file for complete search history.

(56) References Cited

U.S. PATENT DOCUMENTS

| | | | | |
|---|---|---|---|---|
| 5,253,214 A | * | 10/1993 | Herrmann | 365/233 |
| 5,265,231 A | * | 11/1993 | Nuwayser | 711/106 |
| 5,873,114 A | * | 2/1999 | Rahman et al. | 711/106 |
| 6,167,484 A | * | 12/2000 | Boyer et al. | 711/106 |
| 6,178,486 B1 | * | 1/2001 | Gill et al. | 711/151 |
| 6,195,303 B1 | * | 2/2001 | Zheng | 365/222 |
| 6,275,895 B1 | * | 8/2001 | Tabo | 711/106 |
| 6,298,413 B1 | * | 10/2001 | Christenson | 711/106 |
| 6,400,631 B1 | * | 6/2002 | Williams et al. | 365/222 |
| 6,415,353 B1 | * | 7/2002 | Leung | 711/106 |
| 6,484,246 B1 | * | 11/2002 | Tsuchida et al. | 711/169 |
| 6,587,918 B1 | * | 7/2003 | Christenson | 711/106 |

* cited by examiner

*Primary Examiner*—B. James Peikari
*Assistant Examiner*—Zhuo H. Li
(74) *Attorney, Agent, or Firm*—Tung & Assoc.

(57) ABSTRACT

In a memory device with a bank of N memory blocks, an address is generated for a first and a second one of the blocks. The first and second addresses include addresses for current first and second possible "refresh blocks". If its memory block does not contend with the current first possible refresh block, an externally generated access to one of the N memory blocks is permitted and at least a portion of the refresh block is refreshed during a certain interval. In another aspect, the externally generated access is permitted and at least a portion of the current second possible refresh block is refreshed during the same certain interval if: i) the memory block of the externally generated access contends with the current first possible refresh block and ii) the current first and second possible refresh blocks are different ones of the N memory blocks.

18 Claims, 5 Drawing Sheets

METHOD AND APPARATUS FOR DYNAMIC MEMORY REFRESHING

FIELD OF THE INVENTION

The invention relates generally to dynamic memory, i.e., memory which requires periodic refreshing, and more particularly to a method and apparatus for refreshing dynamic memory.

BACKGROUND OF THE INVENTION

In solid-state dynamic memory, such as dynamic random access memory ("DRAM"), information stored in the memory decays over a period of time. Therefore, before the information decays to such an extent that it is lost, the memory contents must be refreshed. Conventionally, for a DRAM array the refreshing proceeds sequentially through each word of the array, under control of a counter. Since external accesses to the array tend to contend with refreshing, it is conventional to include design features for the array which mitigate contention. For example, it is conventional for a DRAM array to be segmented into numerous memory banks and for refreshing to proceed in one bank concurrently with an external access in another. However, refreshing and external access can still contend if both attempt to operate on the same bank at the same time. Therefore there is a need for an improved method and apparatus for refreshing of DRAM arrays.

SUMMARY OF THE INVENTION

The foregoing need is addressed in the present invention. According to a method form of the invention, in a memory device with a bank of N memory blocks an address is generated for a first one of the blocks. Likewise an address is generated for a second one of the blocks. The first address includes an address for a current first possible "refresh block." The second address includes an address for a current second possible "refresh block." The two possible refresh blocks are candidates to be the next to have at least a portion thereof refreshed.

With the first and second possible refresh blocks having been designated, the current first possible refresh block and an externally generated access to one of the N memory blocks are checked for contention. The externally generated access to the one of the N memory blocks is permitted during a certain interval, and the at least portion of the current first possible refresh block is refreshed during the same certain interval if the memory block of the externally generated access does not contend with the current first possible refresh block.

In another aspect, the externally generated access is permitted during the certain interval, and the at least portion of the current second possible refresh block is refreshed during the same certain interval if: i) the memory block of the externally generated access contends with the current first possible refresh block and ii) the second possible refresh block is a different one of the N memory blocks than the first possible refresh block.

In still another aspect, the externally generated access is permitted during the certain interval, and an idle external access interval is initiated if: i) the memory block of the externally generated access contends with the current first possible refresh block, and ii) the current first and second possible refresh blocks are the same block, i.e., there is just one possible refresh block designated. Then, the one possible refresh block is refreshed during the idle external access interval.

According to an apparatus form of the invention, a memory apparatus includes a memory array segmented into N memory blocks, and first and second address generators. In operation of the apparatus, the first address generator generates an address of a first one of the N memory blocks as a current first possible refresh block and the second address generator generates an address of a second one of the N memory blocks as a current second possible refresh block. The apparatus also has a multiplexer for receiving the current first possible refresh block and the current second possible refresh block from the respective address generators. It also includes external access compare logic operable to compare the block of an externally generated access to the current possible refresh block of the first address generator. The apparatus is operable to permit the externally generated access to access the one of the N memory blocks during a certain interval, and, responsive to the external access compare logic indicating that the memory block of the externally generated access does not contend with the current first possible refresh block, the multiplexer is operable to select at least a portion of the current first possible refresh block for refreshing during the certain interval.

In another aspect, the apparatus includes refresh block compare logic operable for checking whether the first and second address are currently designating the same possible refresh block. The apparatus is operable to permit the externally generated access to access the one of the N memory blocks during the certain interval, and, responsive to i) the external access compare logic indicating that the memory block of the externally generated access contends with the current first possible refresh block and ii) refresh block compare logic indicating that the current second possible refresh block is a different one of the N memory blocks, the multiplexer is operable to select at least a portion of the current second possible refresh block for refreshing during the certain interval.

In still another aspect, the apparatus includes access control logic operable for initiating an idle external access interval responsive to i) the external access compare logic indicating that the memory block of the externally generated access contends with the current first possible refresh block and ii) refresh block compare logic indicating that the current first and second possible refresh blocks are a same one possible refresh block, so that the one possible refresh block may be refreshed during the idle external access interval.

Objects and advantages of the invention will become apparent upon reading the following detailed description and upon reference to the accompanying drawings.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
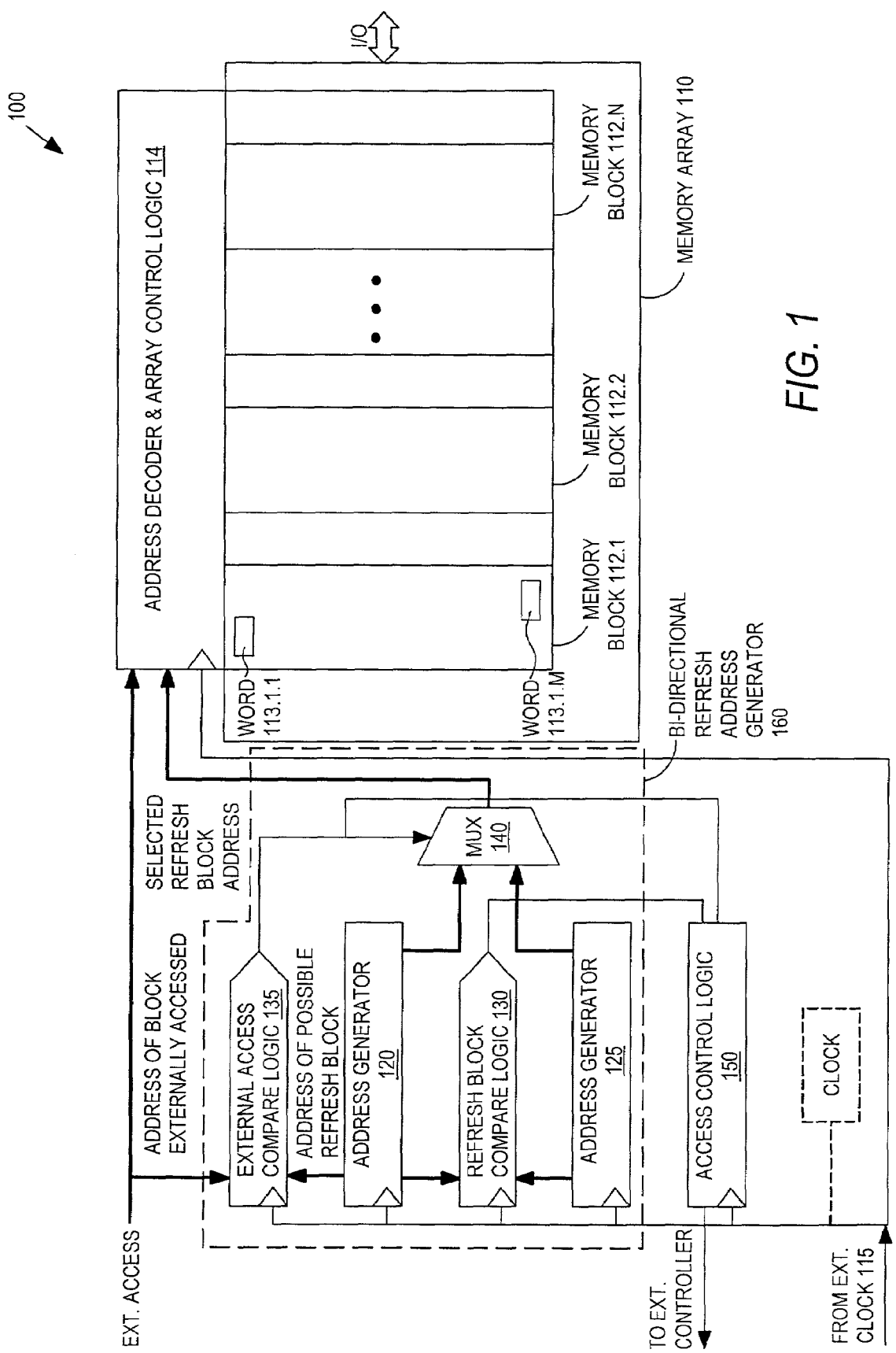
FIG. 1 shows a memory apparatus, according to an embodiment of the invention.

While the invention is susceptible to various modifications and alternative forms, specific embodiments thereof are shown by way of example in the drawings and will be described herein in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Referring now to FIG. 1, an integrated circuitry chip 100 is depicted according to an embodiment of the invention. The chip 100 has a dynamic memory array segmented into N memory blocks 112.1 through 122.N. Each memory block 112 has M words 113. For memory block 112.1, a first such word, word 113.1.1, and a last such word, word 113.1.M, are explicitly depicted in FIG. 1. The chip 100 receives a clock signal 115 for timing external access and memory refresh operations. Alternatively, the chip 100 may have its own clock (as shown in dashed lines) for timing one or both of these operations. For each clock 115 cycle there may be an external access to one of the memory blocks and a refresh of a word in one of the blocks, unless there is an unresolvable contention.

The chip 100 has a bidirectional refresh address generator 160 that includes a first address generator 120 and second address generator 125, refresh block compare logic 130, external access compare logic 135 and multiplexer 140. The two address generators 120 and 125 that generate first and second addresses, respectively. Such an address represents a possible refresh block, and a word therein, i.e., a possible block and word therein for refreshing. The first address generator generates a sequence of addresses starting with block 112.1, word 113.1.1. The sequence proceeds sequentially through all the words in the block to the last word 113.1.M, and then to the next block upward among the blocks, block 112.2, and the first word in the block, word 113.2.1 (not shown), sequentially through all the words in block 112.2, and then to block 112.3 (not shown), word 113.3.1 (not shown), and so on.

The second address generator generates a sequence starting with block 112.N, word 113.N.1 (not shown). The second sequence then proceeds sequentially through all the words in the block to the last word 113.N.M. (not shown). Next, the sequence proceeds downward to block 112.(N−1) (not shown), beginning with word 113.(N−1).1 (not shown), and sequentially through all the words in block 112.(N−1) (not shown). Next, the sequence proceeds to block 112.(N−2) (not shown), and so on.

Figure 3A:
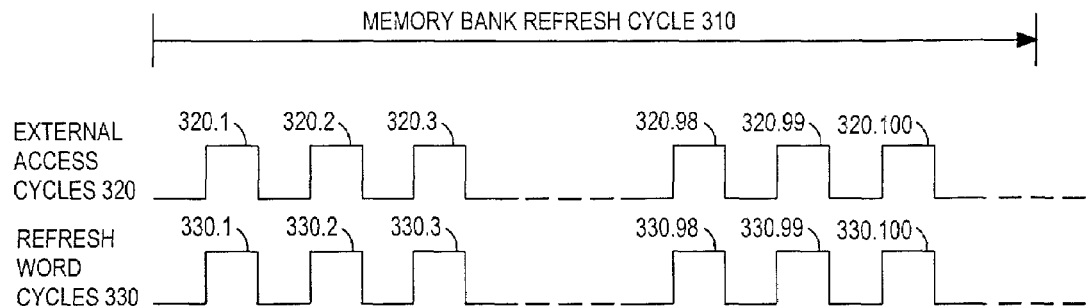
FIGS. 3A, 3B and 3C show timing diagrams to illustrate timing aspects, according to an embodiment of the invention.

Referring now to FIG. 3A, the interrelationship among various cycles which have been referred to are illustrated. To simplify the description, for the embodiments of FIGS. 3A, 3B and 3C there are ten memory blocks 112 (FIG. 1), each having ten words. In a preferred memory block 112 there would be more than ten words 113.

The refreshing of all ten blocks is shown in FIG. 3A, in memory bank refresh cycle 310. Note that during each of the word refresh cycles 330, there may be a refresh of a single word, and during each of the external access cycles 320 there may be an external access to a word. In contrast, during the memory bank refresh cycle 310 there are many word refresh cycles 330 and external access cycles 320. The memory bank refresh cycle 310 begins with no blocks 112 refreshed, and ends with all words 113 in all ten blocks 112 having been refreshed one time. Then the memory bank refresh cycle 310 repeats itself.

In the embodiment depicted in FIG. 3A, there is one external access cycle 320 for each refresh word cycle 330. Further, to simplify the issues depicted, in the illustration of FIG. 3A, no contention is depicted between external access and refresh operations. Thus, in one memory bank refresh cycle 310, external access cycles 320.1, 320.2, 320.3, etc. through 320.100 occur concurrently with word refresh cycles 330.1, 330.2, 330.3, etc. through 330.100.

Figure 3B:
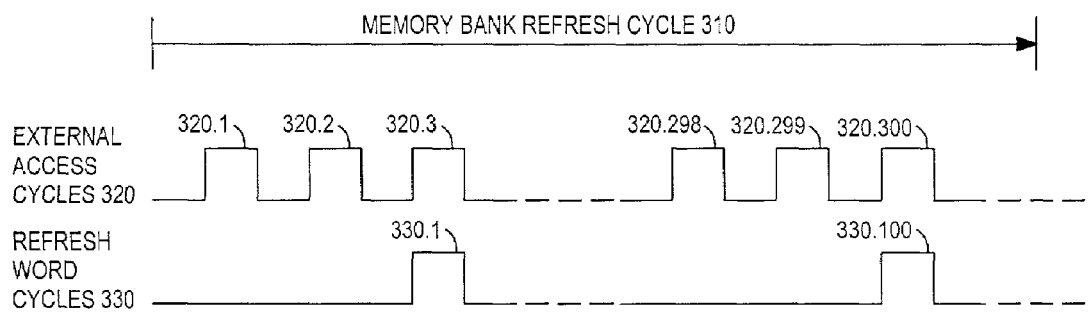
Figure 3C:
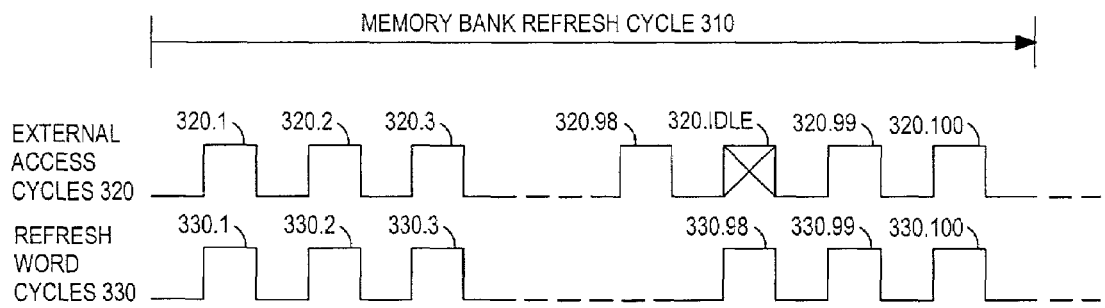

In the embodiment depicted in FIG. 3B, there are three external access cycles 320 for each refresh word cycle 330. In the illustration of FIG. 3B, as it was in FIG. 3A, no contention is depicted between external access and refresh operations. Thus, in FIG. 3B at the beginning of the memory bank refresh cycle 310 external access cycles 320.1 and 320.2 occur without any occurrence of a refresh word cycle, and then the external access cycle 320.3 and refresh word cycle 330.1 occur concurrently. Then at the end of the memory bank refresh cycle 310, external access cycles 320.98 and 320.99 occur without any occurrence of a refresh word cycle, and then the external access cycle 320.100 and refresh word cycle 330.100 occur concurrently.

In the embodiment depicted in FIG. 3C, there is again one external access cycle 320 for each refresh word cycle 330, however, one instance of otherwise unresolvable contention, i.e., a contention requiring that an idle external access cycle be inserted, is now depicted between an external access and refresh operation. Thus, in one memory bank refresh cycle 310, external access cycles 320.1, 320.2, 320.3, etc. occur concurrently with word refresh cycles 330.1, 330.2, 330.3, etc., until at external access cycle 320.98, when contention is depicted. Due to the contention the external access 320.98 occurs, but the corresponding word refresh operation 330.98 is deferred. Then an idle external access cycle, 320.idle, is inserted, during which the deferred refresh operation 330.98 is performed. In the last two cycles of the word refresh cycles 330 of the memory bank cycle 310 no further contention is depicted, so external access cycles 320.99 and 320.100 are shown occurring concurrently with 330.99 and 330.100.

For a particular refresh word cycle 330, the first address designates a first one of the N memory blocks as a first possible refresh block, e.g., block 1, and the second address designates a second one of the N memory blocks as a second possible refresh block, e.g., block N.

Referring again to FIG. 1, since the first address generator sequence starts with the first block, block 112.1, and proceeds sequentially upward toward block 112.N, and the second address generator sequence starts with block 112.N and proceeds sequentially downward toward block 112.1, once the two sequences both reach the same block, that block inherently must be the last of the N blocks to be refreshed in the current refresh cycle 310. Therefore, the chip 100 includes compare logic, i.e., refresh block compare logic 130, for checking whether the first and second sequence are currently designating the same possible refresh block.

The chip 100 also has other compare logic, i.e., external access compare logic 135, for comparing addresses of the block 112 of an externally generated access and the current possible refresh block of the first address generator 120. That is, if during a current cycle the externally generated access is to block 112.1 and the first address generator's possible refresh block is block 112.1, the first possible refresh block and the block of the externally generated access contend with one another for the same block. If there is contention between the first address generator's possible refresh block and the externally generated access, the second address generator's possible refresh block will not contend with the externally generated access, unless the refresh block compare logic 130 indicates that the first and second sequence generators are currently designating the same possible refresh block.

The chip also has a multiplexer 140 for selecting the first address generator's possible refresh block for refreshing if it does not contend with the block of the externally generated access, and for selecting the second address generator's possible refresh block for refreshing if the first possible refresh block does contend, unless the first possible refresh block and the second possible refresh block are the same.

In this manner, contention is reduced between externally generated accesses and internally generated refresh operations. Contention is avoided altogether in any given refresh cycle until the last block is being refreshed. Therefore, since there is less potential for contention during a given refresh cycle, more time can be used to deal with whatever contention does arise. For example, according to an embodiment, a controller (not shown) controls the externally generated accesses to the chip's memory array, and the chip 100 includes access control logic 150 for requesting the external controller to insert an idle cycle in response to contention during refreshing of the last block in the refresh cycle. That is, logic 150 receives inputs from compare logic 130 and 135, and if external access compare logic 135 indicates that the block of an external access and the possible refresh block of the first address generator 120 are the same, and if the refresh block compare logic 130 also indicates that the possible refresh block of the first address generator 120 is the same as the possible refresh block of the second address generator 125, then logic 150 requests the external controller to insert an idle cycle, during which no external request is issued for accessing memory array 110, so that a word in the contended for block may be refreshed. Since instances of these idle cycle requests are limited by the invention to requests during refreshing of the last block in a refresh cycle, the time interval between idle cycle requests can be increased.

Figure 2:
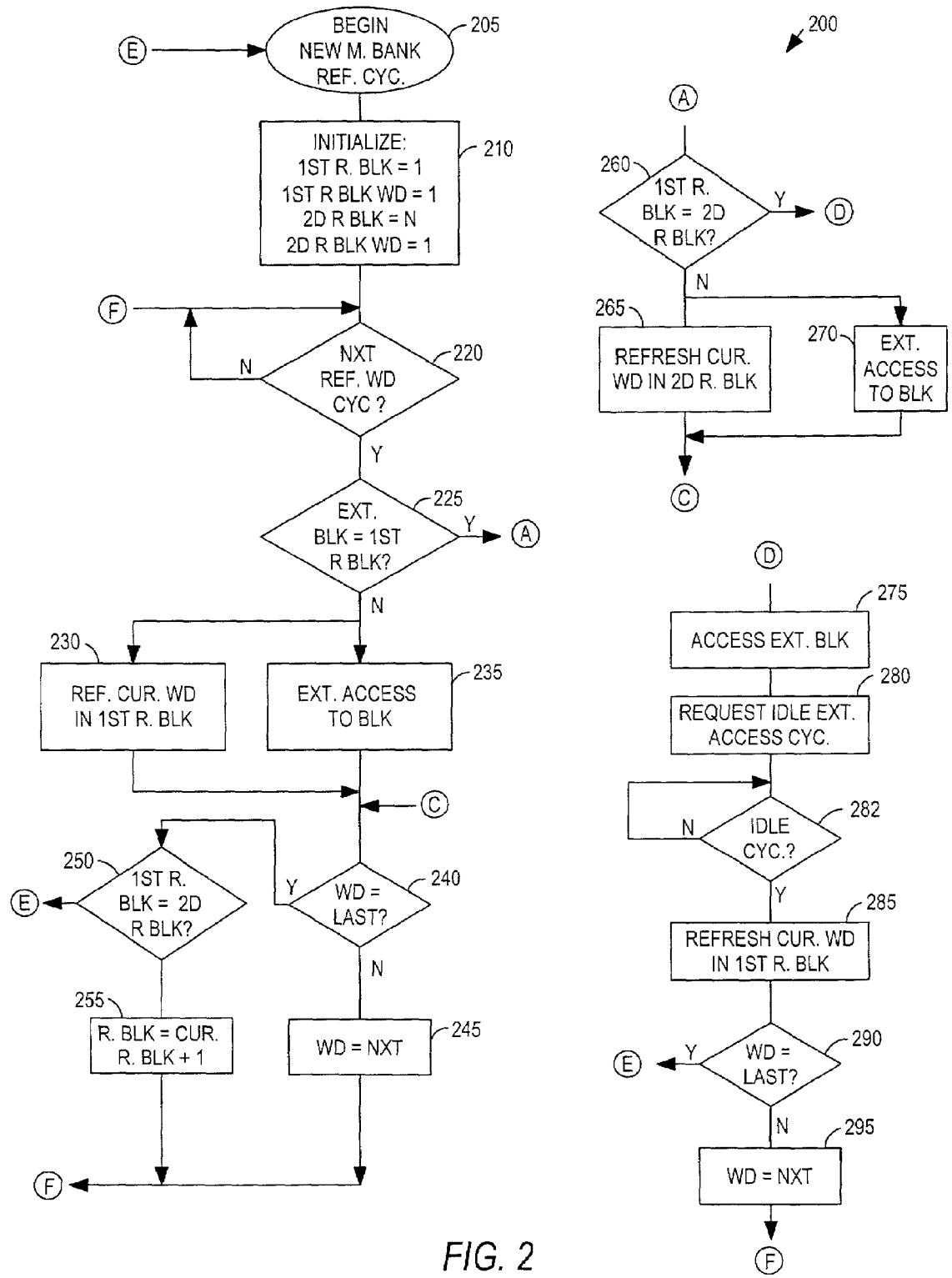
FIG. 2 shows an algorithm in the form of a flow chart, according to an embodiment of the invention.

Referring now to FIG. 2, an algorithm 200 is depicted, according to one embodiment, in the form of a flow chart. At 205, a refresh cycle begins for the bank of N memory blocks of the chip. At 210, the first address generator 120 (FIG. 1) generates an initial address=block 112.1, i.e., the first block of the memory blocks 112.1 through 112.N (FIG. 1). This block 112.1 is thus the first possible refresh block. Also at 210, the second address generator 125 (FIG. 1) generates an initial address=block 112.N, i.e., the last block of the bank of memory blocks 112.1 through 112.N. This block 112.N is thus the second possible refresh block. One of these blocks 112.1 and 112.N will be the next block to have at least a portion thereof, e.g., a word, refreshed. Accordingly, at 210, the first address generator 120 also generates an initial address, in this case word 1, for the first word to be refreshed in block 112.0. Likewise, the second address generator 125 generates an initial address, also word 1, for the first word to be refreshed in block 112.N.

Next, at 220, the algorithm waits for the next refresh word cycle. Then, at 225, the first possible refresh block 112.1 and an externally generated access to one of the N memory blocks are checked for contention. If they do not contend, then at 230 the externally generated access to the one of the N memory blocks is permitted during the refresh word cycle, and at 235 the word 1 of the first possible refresh block 112.1 is refreshed, also during the refresh word cycle. If the first possible refresh block 112.1 and externally generated access to the one of the N memory blocks do contend, then at 260 the first and second possible refresh blocks, in this instance 112.1 and 112.N, are checked to see if they are the same one of the N memory blocks. If they are not the same, then at 270 the externally generated access is permitted to the one of the N memory blocks during the refresh word cycle, and at 265 the word 1 of the second possible refresh block 112.N is refreshed, also during the refresh word cycle.

As was previously stated, and as will be described further hereinbelow in this description of the algorithm 200, the first address generator 120 (FIG. 1) sequences the first possible refresh blocks from the first block 112.1 upward to the last 112.N, whereas the second address generator 125 (FIG. 1) sequences the second possible refresh blocks from the last block 112.N downward to the first 112.1. Consequently, once the first and second possible refresh blocks are the same this indicates that all the other blocks have been refreshed in the current refresh cycle, and therefore any contention for a block between the external access and refresh operations will not permit both operations to occur concurrently, since there is only one possible refresh block left to refresh during the current memory bank refresh cycle. Therefore, if it is determined at 225 that the memory block of the externally generated access contends with the first possible refresh block, and it is determined at 260 that the first and second possible refresh blocks are the same block, this indicates there is only one possible refresh block. Thus, responsive to this circumstance, at 275 the externally generated access to the one of the N memory blocks is permitted during the current external access cycle, and at 280 an idle external access interval is initiated. Then, the idle external access cycle is awaited at 282, and when it arrives the current word in the first possible refresh block, which in this instance is the one possible refresh block, is refreshed at 285 during the awaited idle external access interval.

Next, at 290 the current word in the first possible refresh block is checked to see if it is the last word. If not, then the address generator 120 (FIG. 1) indexes to the next word at 295 and then the algorithm branches to 220 to await the next refresh word cycle. If at 290 it is determined that the current word in the first possible refresh block is the last word, then the algorithm branches to 205 to begin a new memory bank refresh cycle.

As stated in connection with 210, the algorithm 200 of the present embodiment includes generating an address for a word of the current first possible refresh block. Now refer back to 230 and 235, for the instance where the current first possible refresh block and the externally generated access to the one of the N memory blocks do not contend. Once the externally generated access is permitted at 235 and the word of the current first possible refresh block is refreshed at 230, the word of the current first possible refresh block is then checked at 240 to see if it is the last word in the block. If it is not, then at 245 the address generator 120 (FIG. 1) indexes to the next word in the block, and then the algorithm branches back to 220 to await the next refresh word cycle.

If it is the last word in the block, then at 250 the current first and second possible refresh blocks are checked to see if they are the same, i.e., to see whether the refresh cycle is now on the last block to be refreshed. If they are not the same block, then at 255 the first address generator 120 (FIG. 1) indexes the first possible refresh block to the next block, and branches to 220 to await the next refresh cycle. If it is determined at 250 that the current possible refresh blocks are the same, this indicates that the last word of the last block in the current refresh cycle has been refreshed, and the algorithm branches back to 205 to begin another memory bank refresh cycle.

Now referring back again, recall that if the current first possible refresh block and the externally generated access to the one of the N memory blocks do contend, as determined at 225, and the first and second possible refresh blocks are different, as determined at 260, then in this circumstance at 270 the externally generated access is permitted to the one of the N memory blocks during the refresh word cycle, and at 265 the current word of the current second possible refresh block is refreshed, also during the current refresh word cycle. Following this refreshing of the second possible refresh block at 265, the current word of the current second possible refresh block is then checked at 240 to see if it is the last word in the block. If it is not, then at 245 the address generator 125 (FIG. 1) indexes to the next word in the block, and then the algorithm branches back to 220 to await the next refresh word cycle. If it is the last word in the block, then at 250 the current first and second possible refresh blocks are checked to see if they are the same, i.e., to see whether the refresh cycle is now on the last block to be refreshed. If they are not the same block, then at 255 the second address generator (FIG. 1) indexes the second possible refresh block to the next block, and branches to 220 to await the next refresh cycle. If it is determined at 250 that the current possible refresh blocks are the same, this indicates that the last word of the last block in the current refresh cycle has been refreshed, and the algorithm branches back to 205 to begin another memory bank refresh cycle.

Figure 4:
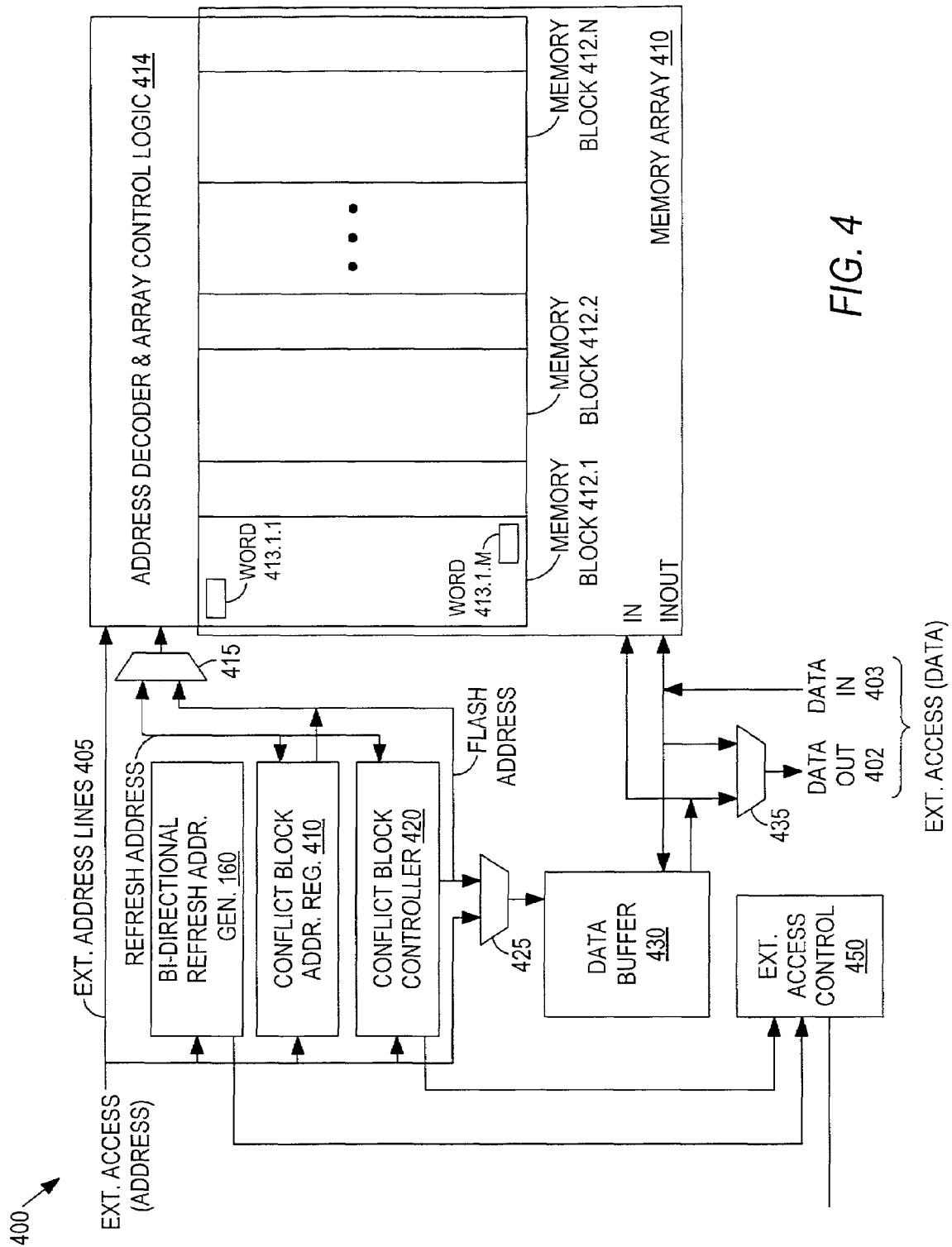
FIG. 4 shows an integrated circuit chip having a memory array and an address decoder and control logic, according to an alternate embodiment.

Referring now to FIG. 4, an integrated circuit chip 400 having a memory array 410 and address decoder and control logic 414 is depicted, according to an alternative embodiment of the invention. A clock is not explicitly shown in this depiction, but its arrangement should be understood from the depiction of the chip 100 in FIG. 1. The chip 400 has a bi-directional refresh address generator 160. As has been described herein above, the bi-directional refresh address generator 160 enables a set of N−1 blocks in the memory array 410 to be refreshed while accessing any of the N blocks of the array 410. That is, responsive to contention arising between an external access to one of the N−1 blocks and refreshing of the block, an alternative one of the N−1 blocks is refreshed (using an address from the bi-directional address generator 160) so that contention between refreshing and external accessing is averted for the N−1 of the blocks in a cycle of completely refreshing all N blocks (a "memory bank refresh cycle").

According to the present alternative embodiment, when the last block, that is, the Nth block, is reached in a memory bank refresh cycle, the conflict block address register 410 is loaded with the address of the last block, and the conflict block controller 420 initiates copying of the last block to the conflict block data buffer 430, that is, "filling" of the buffer 430. As the buffer 430 is being filled, addresses of external accesses to the array 410 are compared by the controller 420 to addresses of data in the buffer 430. If there is a match (a "hit") then the controller 420 causes the external access to use the data buffer 430 instead of the array 410. That is, the conflict block controller 420 causes external write operations at external data input 403 to write to the data buffer 430 instead of the array 410, and external read operations at data output 402 to read from the data buffer 430 instead of array 410, via multiplexer 435. The use of the data buffer 430 and its associated elements permits refreshing of the last block in the array 410 concurrent with external accesses during access cycles when the external accesses are not to the same block, and even during access cycles when they are to the same block provided that the external accesses hit in the buffer.

Figure 5:
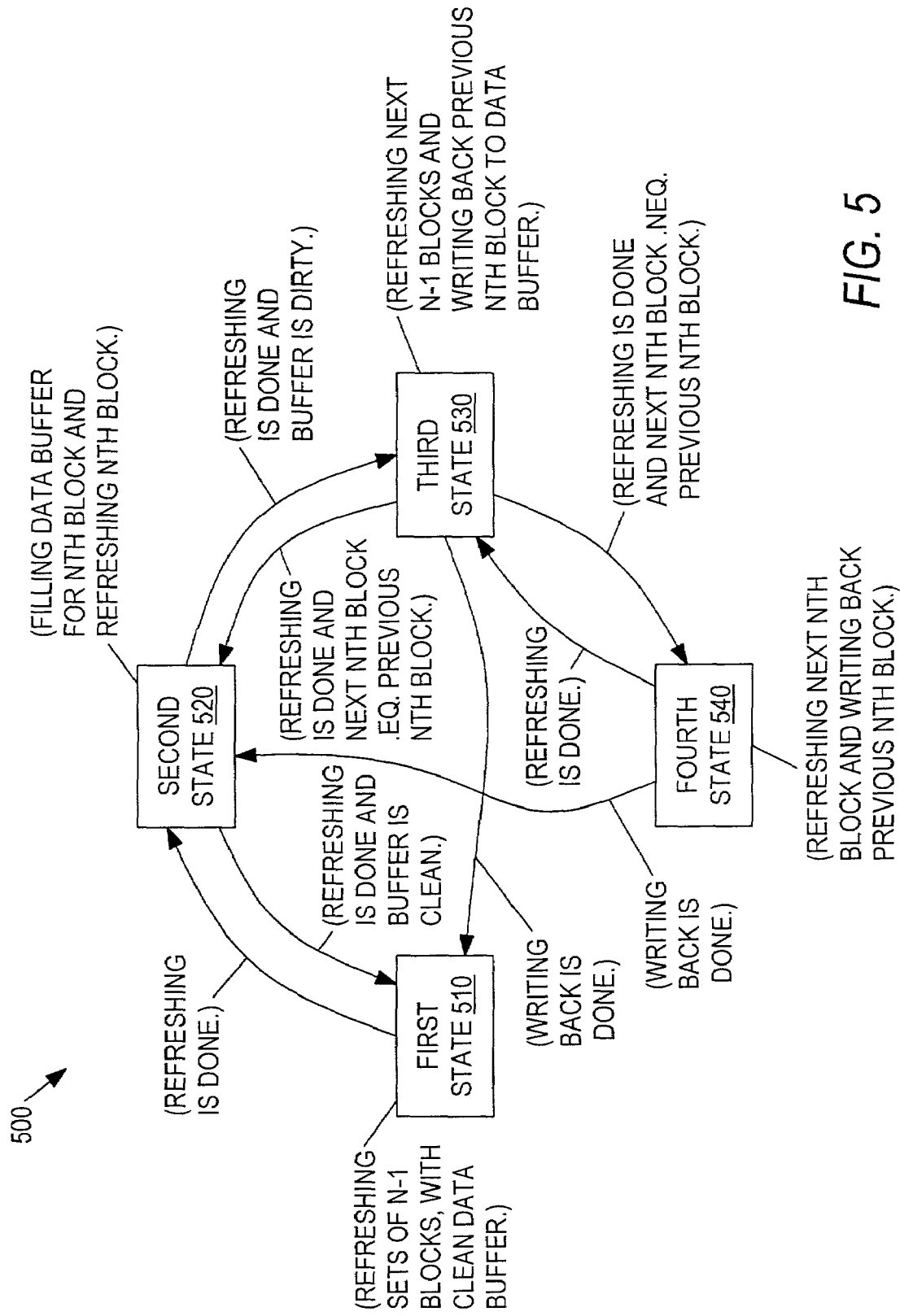
FIG. 5 further illustrates certain aspects of FIG. 4 in a state diagram form, according to an embodiment.

Referring now to FIG. 5, certain aspects are further illustrated in a state diagram form, according to an embodiment of the invention. (Reference will also be made in describing FIG. 5 to elements of the chip 400 depicted in FIG. 4. These chip 400 elements are numbered "4xx.") In a first state 510, the data buffer 430 is clean and a set of N−1 blocks of the array 410 are refreshing. Once the N−1 blocks are refreshed, the chip 400 moves to a second state 520, in which the buffer 430 fills for the last, i.e., Nth, block of the set. The Nth block is thus buffered while refreshing in this second state 520, so that external accesses are permitted concurrently with refreshing the Nth block on the condition that the external accesses are not to the Nth block or else they hit in the buffer 430. If there have not been external accesses to the last block by the time all the words of the last block have been refreshed, then the buffer 430 is clean and the chip 400 moves back to the first state 510.

A third state 530 arises instead in the above circumstance if there have been external accesses. In the third state 530, a next set of N−1 blocks refreshes and the conflict block controller 420 flushes the buffer 430, which includes the controller 420 causing the multiplexer 425 between the controller 420 and the buffer 430 to select addresses from the controller 420 for copying from the buffer 430, and causing the multiplexer 415 between the controller and the address decoder and array control logic 414 to select addresses from the controller 420 for writing to the Nth block of the array 410. In this third state 530 the Nth block is still buffered while flushing, so that external accesses are permitted concurrently with flushing the Nth block on the condition that the external accesses are not to the Nth block or else they hit in the buffer 430.

If, in the third state 530 the flushing of buffer 430 finishes before the next set of N−1 blocks are refreshed, then the buffer 430 is now clean and the chip 400 goes back to the first state 510. If, on the other hand, the next N−1 blocks get finished refreshing before the buffer 430 finishes writing back to the previous Nth block, then if the identity of the new Nth block in the current set is the same as the identity of the previous Nth block, the chip 400 goes back to the second state 520, in which the flushing of the buffer 430 stops and instead fills for the Nth block, while external accesses are again conditionally permitted to continue concurrent with the Nth block being refreshed.

A fourth state 540 arises in the above circumstance if the identity of the new Nth block in the current set is not the same as the identity of the previous Nth block. Either flushing or refreshing can be done concurrently with external access because they belong to different blocks.

If, in the fourth state 540, the refreshing of the new Nth block (e.g., for the second set) finishes before the flushing of the buffer for the previous Nth block (e.g., for the first set) then the chip 400 goes back to the third state 530, in which a newer still set (e.g., third set) of N−1 blocks refreshes and the buffer 430 continues flushing. However, if instead the flushing finishes first then the chip 400 goes back to the second state 520, in which the buffer 430 fills for the Nth block of the previous set (e.g., second set), while external accesses are permitted to continue concurrently with refreshing of the Nth block of the new set (e.g., second set).

The description of the present embodiment has been presented for purposes of illustration, but is not intended to be exhaustive or to limit the invention to the form disclosed. The depicted example is not meant to imply architectural limitations with respect to the present invention. Many modifications and variations will be apparent to those of ordinary skill in the art. For example, those of ordinary skill in the art will appreciate that the hardware in FIG. 1 may vary depending on the implementation. Other logic may be used in addition to or in place of the hardware depicted in FIG. 1. It should be understood that instead of having refresh block compare logic for detecting that the first and second refresh address generators are designating the same possible refresh blocks, it would be within the spirit and scope of the invention to encompass an embodiment wherein the chip has compare logic for comparing the second address generator's possible refresh block with the block of the externally generated access. Then, if both the compare logic for detecting that the first possible refresh block matches the block of the externally generated access, and the compare logic for detecting that the second possible refresh block matches the block of the externally generated access, this indicates that both the first and second possible refresh blocks are the same.

Also, in the embodiment described, the externally generated access of one of the N memory blocks is permitted during a certain interval, an idle external access interval is initiated responsive to i) the memory block of the externally generated access contending with the current first possible refresh block, and ii) the current first and second possible refresh blocks being a same one possible refresh block, and then the one possible refresh block is refreshed during the idle external access interval. It should be understood that it would be within the spirit and scope of the invention to encompass an embodiment wherein the external access is deferred until a certain interval responsive to i) the memory block of the externally generated access contending with the current first possible refresh block, and ii) the current first and second possible refresh blocks being a same one possible refresh block, the one possible refresh block is refreshed before the certain interval, and then the externally generated access of the one the N memory blocks is permitted during the certain interval.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

The invention claimed is:

1. The A method of refreshing, memory in a memory device having a bank of N memory blocks, the method comprising the steps of:
   generating an address for a first one of the N memory blocks as a current first possible refresh block and address for a current second one of the N memory blocks as a current second possible refresh block, for refreshing at least a portion of one of the possible refresh blocks;
   checking for contention between the current first possible refresh block and an externally generated access to one of the N memory blocks; and
   permitting the externally generated access to the one of the N memory blocks during a certain interval and initiating an idle external access interval responsive to the following: i) the memory block of the externally generated access contending with the current first possible refresh block, and ii) the current first and second possible refresh blocks being a same one possible refresh block; and
   refreshing the one possible refresh block during the idle external access interval.

2. The method of claim 1 further comprising the steps of:
   deferring the external access until a certain interval responsive to the following: i) the memory block of the externally generated access contending with the current first possible refresh block, and ii) the current first and second possible refresh blocks being a same one possible refresh block;
   refreshing the one possible refresh block before the certain interval; and
   permitting the externally generated access to the one of the N memory blocks during the certain interval.

3. The method of claim 1, wherein generating an address for the current first possible refresh block includes generating an address for a current portion of the current first possible refresh block, and wherein the method comprises the step of generating an address for a next portion of the current first possible refresh block responsive to the current portion not being a last portion of the current first possible refresh block.

4. The method of claim 3 further comprising the step of generating an address for a portion of a next first possible refresh block responsive to the current portion being a last portion of the current first possible refresh block.

5. The method of claim 1, wherein generating an address for the current second possible refresh block includes generating an address for a current portion of the current second possible refresh block, and wherein the method comprises the step of generating an address for a next portion of the current second possible refresh block responsive to the current portion not being a last portion of the current second possible refresh block.

6. The method of claim 5 further comprising the step of generating an address for a portion of a next second possible refresh block responsive to the current portion being a last portion of the current second possible refresh block.

7. The method of claim 1, wherein generating an address for the current first possible refresh block includes generating an address for a current portion of the current first possible refresh block, and wherein the method comprises the step of generating an address for a next portion of the current first possible refresh block responsive to the current portion not being a last portion of the current first possible refresh block.

8. The method of claim 7, comprising the step of beginning a new refresh cycle for the bank of N memory blocks responsive to the current portion being a last portion of the current first possible refresh block.

9. A memory apparatus comprising:
   a memory array segmented into N memory blocks;
   first and second address generators, wherein the first address generator is operable to generate an address of a first one of the N memory blocks as a current first possible refresh block and the second address generator is operable to generate an address of a second one of the N memory blocks as a current second possible refresh block;

a multiplexer for receiving the current first possible refresh block and the current second possible refresh block from the respective address generators;

external access compare logic operable to compare the block of an externally generated access to the current possible refresh block of the first address generator, wherein the apparatus is operable permit the externally generated access to the one of the N memory blocks during a certain interval, and, the multiplexer is operable to select the at least portion of the current first possible refresh block for refreshing during the certain interval responsive to the external access compare logic indicating that the memory block of the externally generated access does not contend with the current first possible refresh block;

refresh block compare logic operable for checking whether the first and second address generators are currently designating the same possible refresh block; and access control logic operable for initiating an idle external access interval responsive to i) the external access compare logic indicating that the memory block of the externally generated access contends with the current first possible refresh block and ii) refresh block compare logic indicating that the current first and second possible refresh blocks are a same one possible refresh block, so that the one possible refresh block may be refreshed during the idle external access interval.

10. The apparatus of claim 9 further comprising:

refresh block compare logic operable for checking whether the first and second address generators are currently designating the same possible refresh block, wherein the apparatus is operable to permit the externally generated access to the one of the N memory blocks during the certain interval, and the multiplexer is operable to select the at least portion of the current second possible refresh block for refreshing during the certain interval responsive to i) the external access compare logic indicating that the memory block of the externally generated access contends with the current first possible refresh block and ii) refresh block compare logic indicating that the current first and second possible refresh blocks are different ones of the N memory blocks.

11. The apparatus of claim 10, wherein the second address generator is operable to generate an address for a current portion of the current second possible refresh block, and, responsive to the current portion not being a last portion of the current second possible refresh block, to generate an address for a next portion of the current second possible refresh block.

12. The apparatus of claim 11, wherein the second address generator is operable to generate an address for a portion of a next second possible refresh block responsive to the current portion being a last portion of the current second possible refresh block.

13. The apparatus of claim 9 further comprising:

refresh block compare logic operable for checking whether the first and second address generators are currently designating the same possible refresh block; and access control logic operable for deferring the external access to a certain interval responsive to i) the external access compare logic indicating that the memory block of the externally generated access contends with the current first possible refresh block and ii) refresh block compare logic indicating that the current first and second possible refresh blocks are a same one possible refresh block, so that the one possible refresh block may be refreshed before the certain interval and the external access may be performed during the certain interval.

14. The apparatus of claim 9, wherein the first address generator is operable to generate an address for a current portion of the current first possible refresh block, and, responsive to the current portion not being a last portion of the current first possible refresh block, to generate an address for a next portion of the current first possible refresh block.

15. The apparatus of claim 14, wherein the first address generator is operable to generate an address for a portion of a next first possible refresh block responsive to the current portion being a last portion of the current first possible refresh block.

16. The apparatus of claim 9, wherein the first address generator is operable to generate an address for a current portion of the current first possible refresh block, and, responsive to the current portion not being a last portion of the current first possible refresh block, to generate an address for a next portion of the current first possible refresh block.

17. The apparatus of claim 16, wherein the first address generator is operable to initiate a new refresh cycle for the bank of N memory blocks responsive to the current portion being a last portion of the current first possible refresh block.

18. A memory apparatus comprising:

a memory array segmented into N memory blocks;

first and second address generators, wherein the first address generator is operable to generate an address of a first one of the N memory blocks as a current first possible refresh block and the second address generator is operable to generate an address of a second one of the IN memory blocks as a current second possible refresh block;

a multiplexer for receiving the current first possible refresh block and the current second possible refresh block from the respective address generators;

external access compare logic operable to compare the block of an externally generated access to the current possible refresh block of the first address generator, wherein the apparatus is operable to permit the externally generated access to access the one of the N memory blocks during a certain interval, and, the multiplexer is operable to select the at least portion of the current first possible refresh block for refreshing during the certain interval responsive to the external access compare logic indicating that the memory block of the externally generated access does not contend with the current first possible refresh block;

refresh block compare logic operable for checking whether the first and second address generators are currently designating the same possible refresh block, wherein the apparatus is operable to permit the externally generated access to access the one of the N memory blocks during the certain interval, and the multiplexer is operable to select the at least portion of the current second possible refresh block for refreshing during the certain interval responsive to i) the external access compare logic indicating that the memory block of the externally generated access contends with the current first possible refresh block and ii) refresh block compare logic indicating that the current first and second possible refresh blocks are different ones of the N memory blocks; and access control logic operable for initiating an idle interval responsive to i) the external access compare logic indicating that the memory block of the externally generated access contends with the current first possible refresh block and ii) refresh block compare logic indicating that the current first and second possible refresh blocks are a same one possible refresh block.

* * * * *